United States Patent
Ko

(10) Patent No.: US 8,063,431 B2
(45) Date of Patent: Nov. 22, 2011

(54) EEPROM AND METHOD FOR MANUFACTURING EEPROM

(75) Inventor: Kwang Young Ko, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 129 days.

(21) Appl. No.: 12/563,735

(22) Filed: Sep. 21, 2009

(65) Prior Publication Data

US 2010/0084700 A1 Apr. 8, 2010

(30) Foreign Application Priority Data

Oct. 6, 2008 (KR) .................. 10-2008-0097656

(51) Int. Cl.
 *H01L 29/788* (2006.01)
(52) U.S. Cl. ........ 257/315; 438/265; 438/266; 438/264; 438/593; 438/595; 257/316; 257/321

(58) Field of Classification Search .................. 438/262, 438/264, 266; 257/E21.694, E21.662, E21.679
See application file for complete search history.

(56) References Cited

U.S. PATENT DOCUMENTS 7,122,432 B2 * 10/2006 Shimizu et al. ............... 438/266
* cited by examiner

*Primary Examiner* — Matthew Landau
*Assistant Examiner* — Khaja Ahmad
(74) *Attorney, Agent, or Firm* — The Law Offices of Andrew D. Fortney; Andrew D. Fortney

(57) ABSTRACT

An electrically erasable programmable read only memory (EEPROM) is disclosed. The EEPROM includes a tunneling region in a semiconductor substrate, a control gate region in the semiconductor substrate and separated from the tunneling region by a device isolating layer, a tunnel oxide layer in a trench in the semiconductor substrate between the tunneling region and the control gate region, and a polysilicon layer on the tunnel oxide layer.

20 Claims, 12 Drawing Sheets

EEPROM AND METHOD FOR MANUFACTURING EEPROM

This application claims the benefit of Korean Patent Application No. 10-2008-0097656, filed on 6 Oct. 2008, which is hereby incorporated by reference as if fully set forth herein.

BACKGROUND OF THE INVENTION

1. Field of the Invention

The present invention relates to semiconductor devices, and more particularly, to an electrically erasable programmable read only memory (EEPROM) and a method for manufacturing an EEPROM.

2. Discussion of the Related Art

As kinds of non-volatile memories, there are, e.g., a single-poly electrically erasable programmable read only memory (EEPROM) having a single poly-crystalline silicon (polysilicon) layer acting as a gate, a stacked gate (EEPROM tunnel oxide [ETOX]) non-volatile memory (NVM) having two poly-crystalline silicon layers vertically stacked one above another, a dual-poly EEPROM between the single-poly EEPROM and the stacked gate, and a split gate EEPROM.

Generally, although the stacked gate has the smallest cell size and complex circuitry and thus, is suitable for high density or high performance applications, recommending the stacked gate for low density NVM applications may be inappropriate. EEPROM is an advantageous NVM for use in the low density applications. For example, the single-poly EEPROM may be manufactured by adding approximately two mask processes to an otherwise standard process for manufacturing semiconductor logic devices.

Hereinafter, a general EEPROM will be described.

FIG. 1 is a plan or layout view illustrating a general EEPROM cell.

The general EEPROM cell shown in FIG. 1 performs a programming operation and an erase operation by Fowler-Nordheim (F-N) tunneling. A tunneling region 50, a read transistor region 52, and a control gate region 54 shown in FIG. 1 will be described in detail in the following detailed description. The respective regions 50, 52, and 54 include active regions 20A, 20B, and 20C, and wells 10A, 30, and 10B. A patterned polysilicon layer 40 is formed in part over the regions 50, 52 and 54.

In the EEPROM cell shown in FIG. 1, assuming the use of an N-type metal oxide semiconductor (NMOS) transistor, both the wells 10A and 10B are N-type, whereas the well 30 is P-type. In this case, it is necessary to isolate at least part of the EEPROM cell from a P-type semiconductor substrate (see FIG. 2).

Meanwhile, to perform the programming and erase operations, the tunneling of electrons occurs in the tunneling region 50. An efficiency of these operations generally depends on a coupling ratio between a capacitance A of the tunneling region 50 and a capacitance B of the control gate region 54.

To increase the coupling ratio between the two capacitances A and B during the programming and erase operations, an area of the control gate region 54 should be increased to increase an overlap area between the active region 20C and the patterned polysilicon layer 40 in the control gate region 54. However, this increase in overlap may increase the entire size of the cell. As a result, an EEPROM containing a relatively small number of bits (e.g., several tens of bits) may have an increased cell area and consequently, deteriorated (or at least partially inefficient) cell density.

Although it may be suggested to manufacture a dual-poly EEPROM cell in order to achieve enhanced cell density, a dual-poly EEPROM manufacturing process may require a separate process for forming the dielectric layer between the control gate and the floating gate (e.g., for controlling the capacitance between the gates), or a separate process for forming the control gate, resulting in a relatively complicated manufacturing process of the EEPROM cell.

SUMMARY OF THE INVENTION

Accordingly, the present invention is directed to an EEPROM and a method for manufacturing an EEPROM that substantially obviate one or more problems due to limitations and disadvantages of the related art.

An object of the present invention is to provide an electrically erasable programmable read only memory (EEPROM) and a method for manufacturing an EEPROM (particularly a single-poly EEPROM) that assure high cell density without an increase in the area of a cell.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, an electrically erasable programmable read only memory (EEPROM) may include a tunneling region in or on a semiconductor substrate, a control gate region on the semiconductor substrate and separated from the tunneling region by a device isolating layer, a tunnel oxide layer in a trench of the semiconductor substrate between the tunneling region and the control gate region, and a polysilicon layer on the tunnel oxide layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. It will be understood that the structure and operation of the embodiments will be described only by way of example, and therefore, the technical scope of the present invention is not limited to the embodiment(s).

Hereinafter, a semiconductor memory device and a method for manufacturing the same according to a first embodiment of the present invention will be described with reference to the accompanying drawings. In particular, in the following description, an EEPROM cell is described as an example of the semiconductor memory device.

Figure 3:
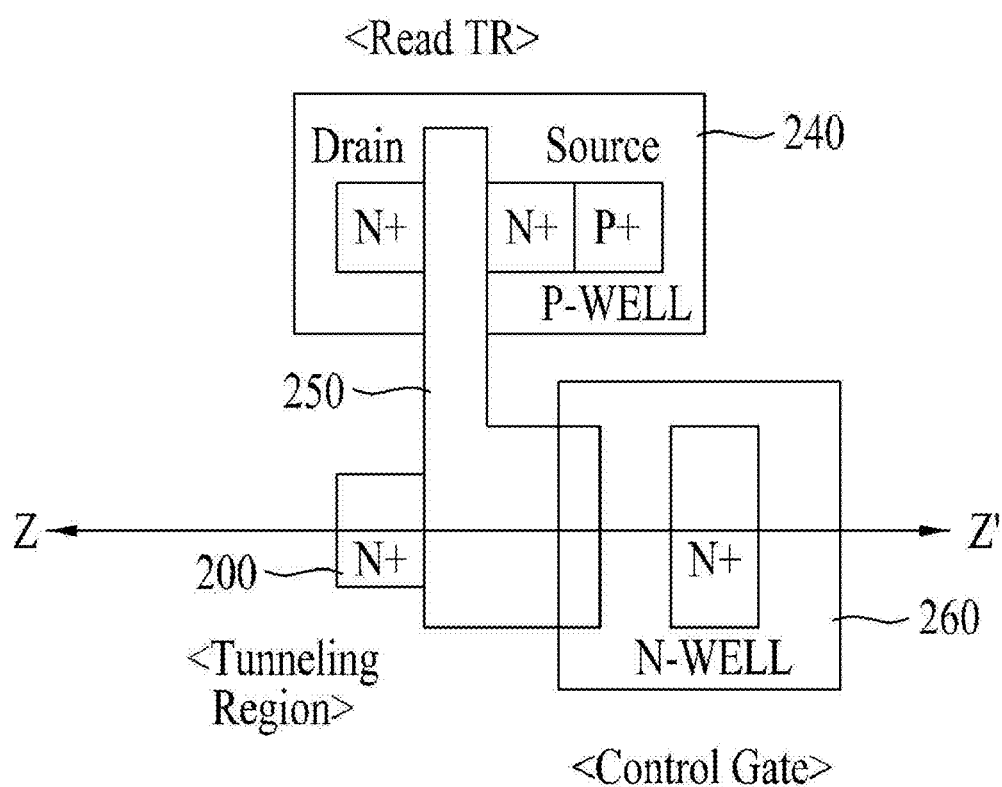
FIG. 3 is an exemplary plan or layout view of an EEPROM cell according to a first embodiment of the present invention.
Figure 4A:
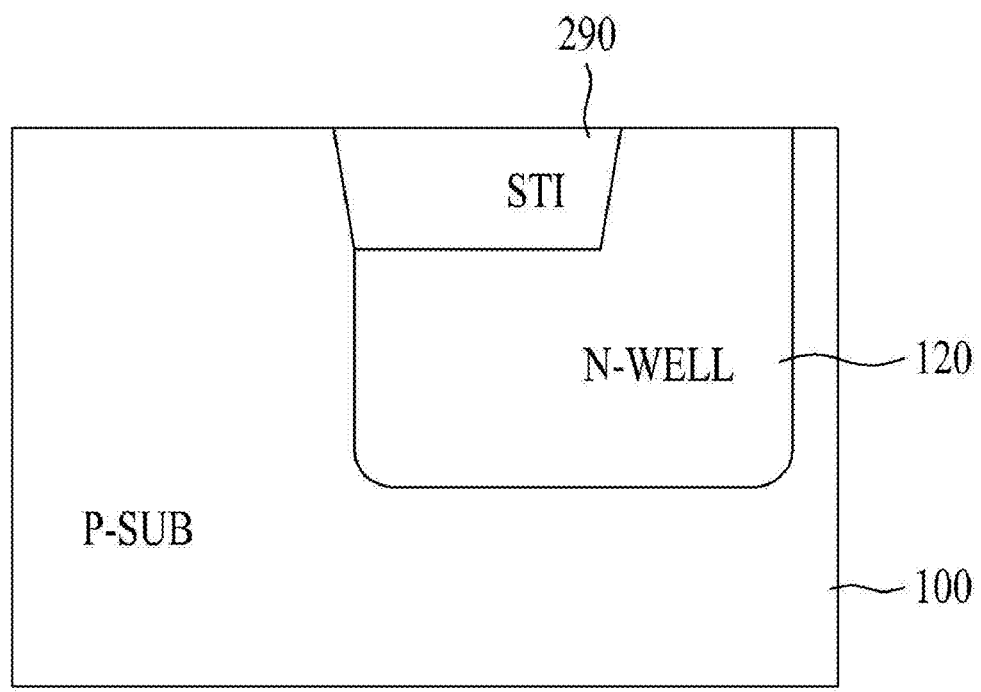
FIGS. 4A to 4D are cross-sectional views illustrating sequential intermediate structures in an exemplary manufacturing process for the EEPROM cell according to the first embodiment.
Figure 4B:
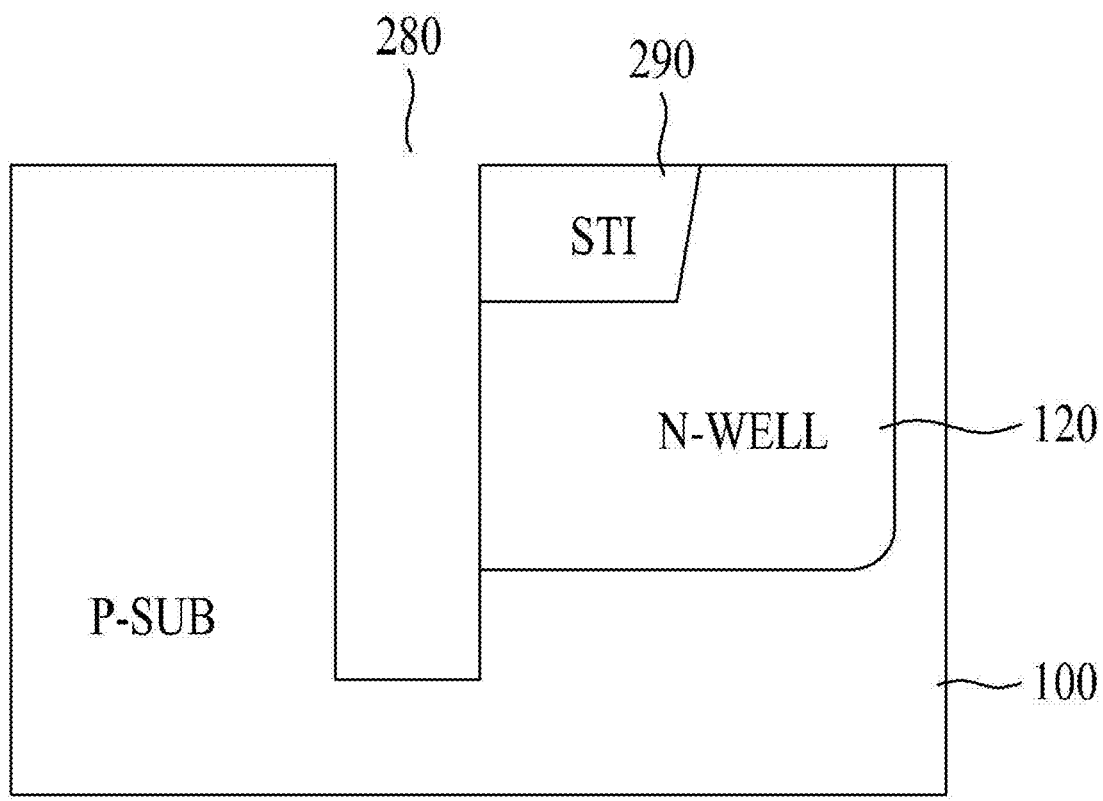
Figure 4C:
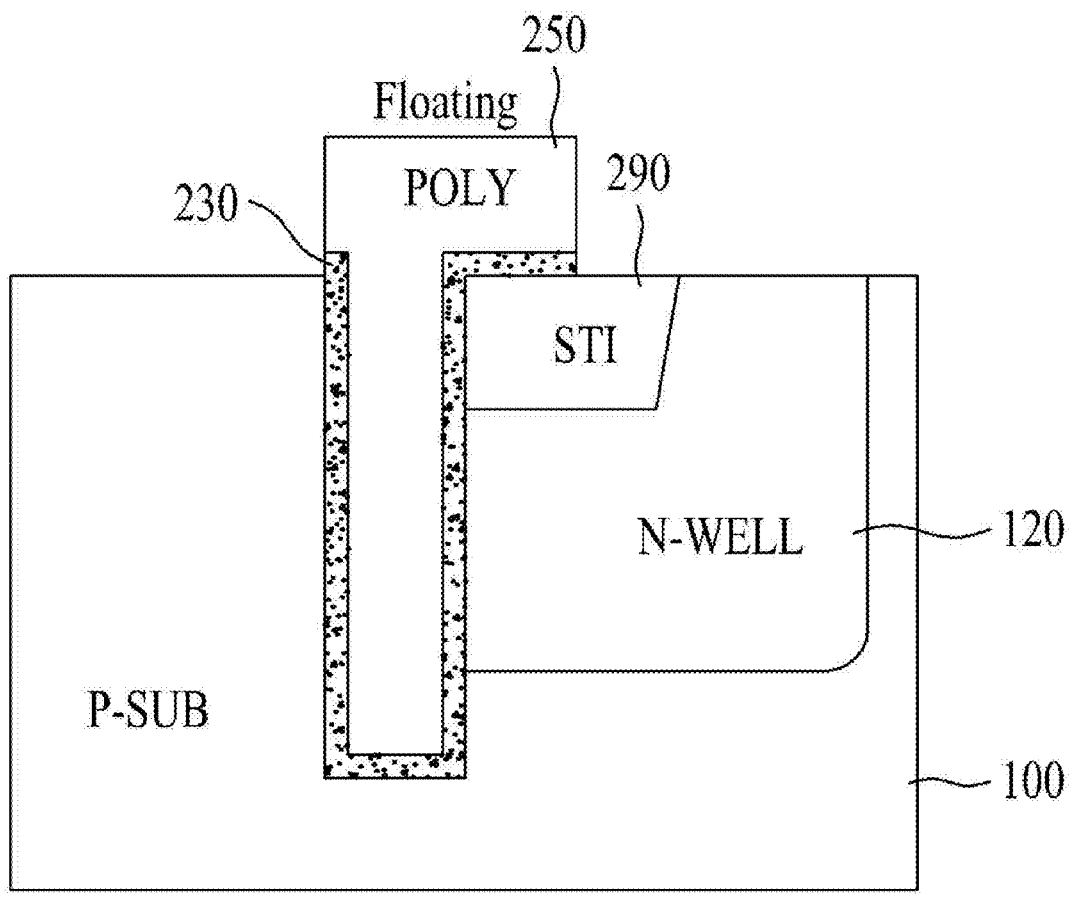
Figure 4D:
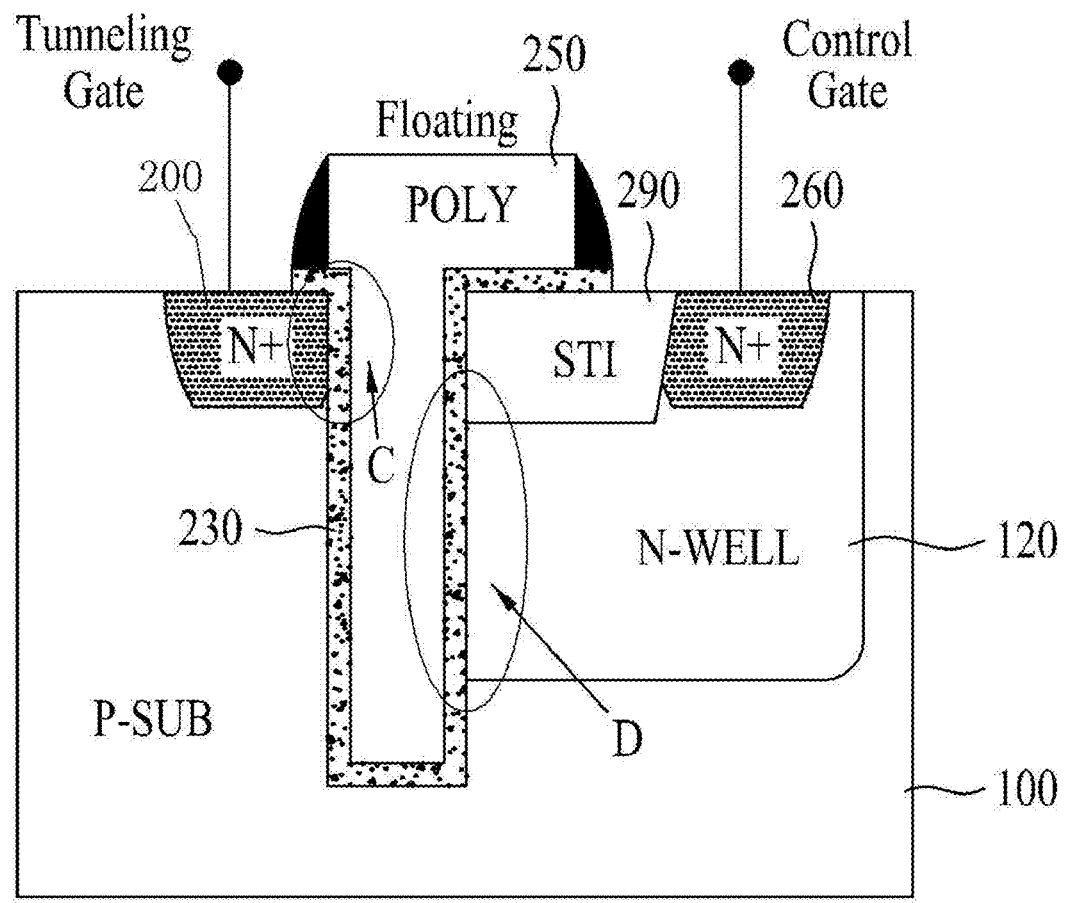

FIG. 3 is a plan or layout view of an EEPROM cell according to the present invention, and FIGS. 4A to 4D are cross-sectional views illustrating intermediate structures in an exemplary process for manufacturing an EEPROM cell according to the present invention. In particular, FIG. 4D is a cross-sectional view taken along the line Z-Z' of FIG. 3.

Prior to describing the present invention, a tunneling region, read transistor region, and control gate region involved in the EEPROM cell will be described in brief hereinafter with reference to FIG. 3.

A Fowler-Nordheim (FN) tunneling operation occurs in an overlap zone where an active region of a tunneling region 200 and a floating poly (or a patterned poly-silicon layer) 250 overlap each other. Here, it is assumed that a capacitance of the overlap zone where the active region of the tunneling region 200 and the floating poly 250 overlap each other is referred to as 'C' (see, e.g., FIG. 4D), and a capacitance of an overlap zone where an active region of a control gate region 260 and the floating poly 250 overlap each other is referred to as 'D' (see FIG. 4D). If the capacitance at D is greater than the capacitance at C, it is preferred to increase the coupling ratio.

Also, if a voltage applied to the tunneling region 200 is referred to as 'V1' and a voltage applied to the control gate region 260 is referred to as 'V2', programming and erase operations are as follows.

First, during a programming operation, a zero voltage is applied to the tunneling region 200 (i.e., V1=0), and a positive voltage s applied to the control gate region 260 (e.g., V2>>0). In this case, electrons are stored on or in the floating poly 250 via an FN tunneling operation. A threshold voltage of the read transistor region 240 increases based on the change in the quantity of electric charge stored on/in the floating poly 250.

Next, during an erase operation, a positive voltage is applied to the tunneling region 200 (e.g., V1>>0), and a zero voltage is applied to the control gate region 260 (i.e., V2=0). In this case, the electrons are discharged from the floating poly 250 via the FN tunneling operation. The threshold voltage of the read transistor region 240 drops based on the change in the quantity of electric charge removed from the floating poly 250. Accordingly, using the read transistor region 240, it may be recognized whether the tunneling region 200 has undergone the programming operation or the erase operation based on the change of the threshold voltage.

Referring to FIGS. 3 and 4D, the floating poly 250 is formed throughout the tunneling region 200, read transistor region 240, and control gate region 260. Since at least part of the floating poly 250 is formed in a trench, the capacitance 'C' of the tunneling region and the capacitance 'D' of the control gate region have a vertical configuration.

Specifically, the tunneling region 200 and the control gate region 260 are isolated from each other by a device isolating layer 290. A tunnel oxide layer 230 and the floating poly 250 are formed in a trench defined between the tunneling region 200 and the device isolating layer 290. This configuration results in vertically formed active regions. Accordingly, the areas of the tunneling region 200 and control gate region 260 may be reduced relative to the layout of FIG. 1 based on the design rule(s) shown in FIG. 4D.

More specifically, forming the floating poly 250 in a trench located between the tunneling region 200 and the control gate region 260 may shorten a length of the floating poly 250 on a horizontal plane of a semiconductor substrate. Therefore, a reduced semiconductor chip size and stable EEPROM cell operation may be accomplished.

In operation of the EEPROM cell, as described above, a tunneling operation occurs between the active region 100, tunnel oxide layer 230, and floating poly 250 based on the voltages V1 and V2 applied to the tunneling region 200 and control gate region 260.

Hereinafter, a method for manufacturing the EEPROM cell according to various embodiments of the present invention will be described with reference to the accompanying drawings.

FIGS. 4A to 4D are cross-sectional views illustrating intermediate structures formed during a process for manufacturing a single poly EEPROM cell according to the embodiment(s) of the present invention.

As shown in FIG. 4A, ions are implanted into a semiconductor substrate 100 via an ion implantation process (e.g., using a photolithographically-defined mask), forming an N-well 120. Then, the device isolating layer 290 is formed to define the tunneling region 200 and control gate region 260 in the semiconductor substrate 100. The device isolating layer 290 may be formed via a Shallow Trench Isolation (STI) process, or a local oxidation of silicon (LOCOS) process. When using the STI process, the device isolating layer 290 may be formed by forming a trench in the semiconductor substrate 100 and filling the trench with one or more dielectrics (e.g., silicon dioxide, which may further include a liner oxide formed by thermal oxidation and a thin liner layer of silicon nitride on the thermal oxide). In a separate photolithography process, a P-well for read transistor 240 (see FIG. 3) may be formed (e.g., by ion implantation) in another region of the substrate 100. The device isolating layer 290 may also be formed between the P-well 240 of the read transistor 240 and N-well 120.

As shown in FIG. 4B, a trench 280 is formed to one side of the device isolating layer 290 (and to the same side of the N-well 120), in which the floating poly 250 will be deposited or buried. To form the trench 280 for the formation of the floating poly 250 in the semiconductor substrate 100, a photoresist pattern (not shown) is formed on the semiconductor substrate 100. As the semiconductor substrate 100 is etched using the photoresist pattern as an etching mask, the trench 280 is formed. Preferably, the semiconductor substrate 100, the device isolating layer 290 and the N-well 120 are etched non-selectively (e.g., with an etchant having etch rates for etching silicon, N-doped silicon and silicon dioxide that are substantially similar to one another). Then, the photoresist pattern is removed by, e.g., an asking process.

Referring to FIG. 3, the trench 280 (corresponding to at least part of floating gate 250) generally extends across the entire interface with the tunneling region 200. In general, the trench 280 does not extend into the P-well of the read transistor 240.

As shown in FIG. 4C, after the trench 280 is formed in the above-described manner, a tunnel oxide layer 230 is formed on an inner wall of the trench 280. The tunnel oxide layer 230 may be formed by deposition of silicon dioxide (e.g., by chemical vapor deposition [CVD] from a silicon source such as tetraethyl orthosilicate and an oxygen source such as dioxygen and/or ozone, or by plasma-enhanced or plasma-assisted CVD from a silicon source such as silane and/or disilane and an oxygen source such as dioxygen) or by wet or dry thermal oxidation (in which case the tunnel oxide layer 230 is not formed over the STI layer 290). In turn, the floating poly 250 is formed over the entire upper (or side) surface(s) of the tunnel oxide layer 230 (and, when the tunnel oxide layer 230 is formed by thermal oxidation, on the STI layer 290). Referring to FIG. 3, forming the tunnel oxide 230 can simultaneously form a gate oxide for the read transistor 240. The floating gate 250 and tunnel oxide layer 230 are patterned by photolithography. Referring now to FIG. 4C, while the edge of the floating gate 250 over STI 290 can extend any distance beyond the photolithography margin over STI 290, preferably the floating gate 250 extends towards the region where tunneling gate 200 (see, e.g., FIGS. 3 and 4D) is formed by a distance about equal to (e.g., from 1.0 to about 1.2 times) the photolithography margin, to ensure that tunnel oxide 230 is protected by the photolithography mask and that the tunneling gate 200 makes adequate contact with the tunnel oxide 230 to enable tunneling of electrons across the tunnel oxide 230.

As shown in FIG. 4D, ions are implanted into substrate 100 on one side of the floating poly 250 via an ion implantation process, forming an N+ dopant region 200, and simultaneously into an opposite side of the floating poly 250 (e.g., across STI 290) via the same ion implantation process, forming an N+ dopant region 260 so that the device isolating layer 290 becomes the boundary between the N+ dopant region 260 and the floating poly 250. Referring back to FIG. 3, the N+ source and drain regions for the read transistor 240 can be formed simultaneously with N+ dopant regions 200 and 260, and P+ contact region (for electrical contact with the P-well for the read transistor 240) can be formed in a separate photolithography and ion implantation process. Generally, the N+ source and drain regions for the read transistor 240 and N+ dopant regions 200 and 260 have a depth less than (but preferably within 75-80% of) the depth of STI 290, and trench 280 has a depth greater than (but preferably not more than about 120% of) the depth of N-well 120.

It is noted that a well for the control gate region 260 may be formed simultaneously with formation of a well for the tunneling region 200. This is because the two wells are of the same conductive type.

Figure 1:
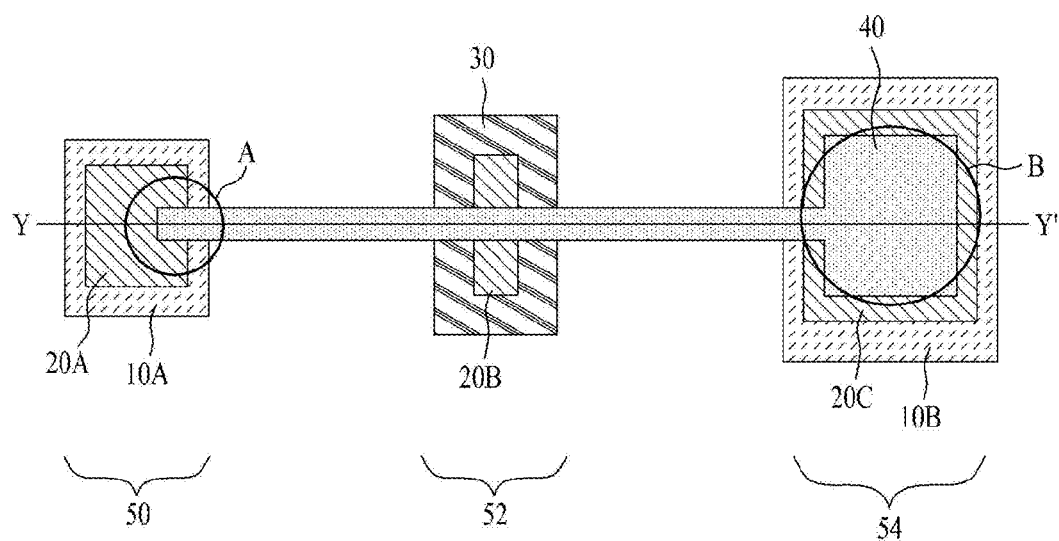
FIG. 1 is a plan or layout view of a general EEPROM cell.
Figure 2:
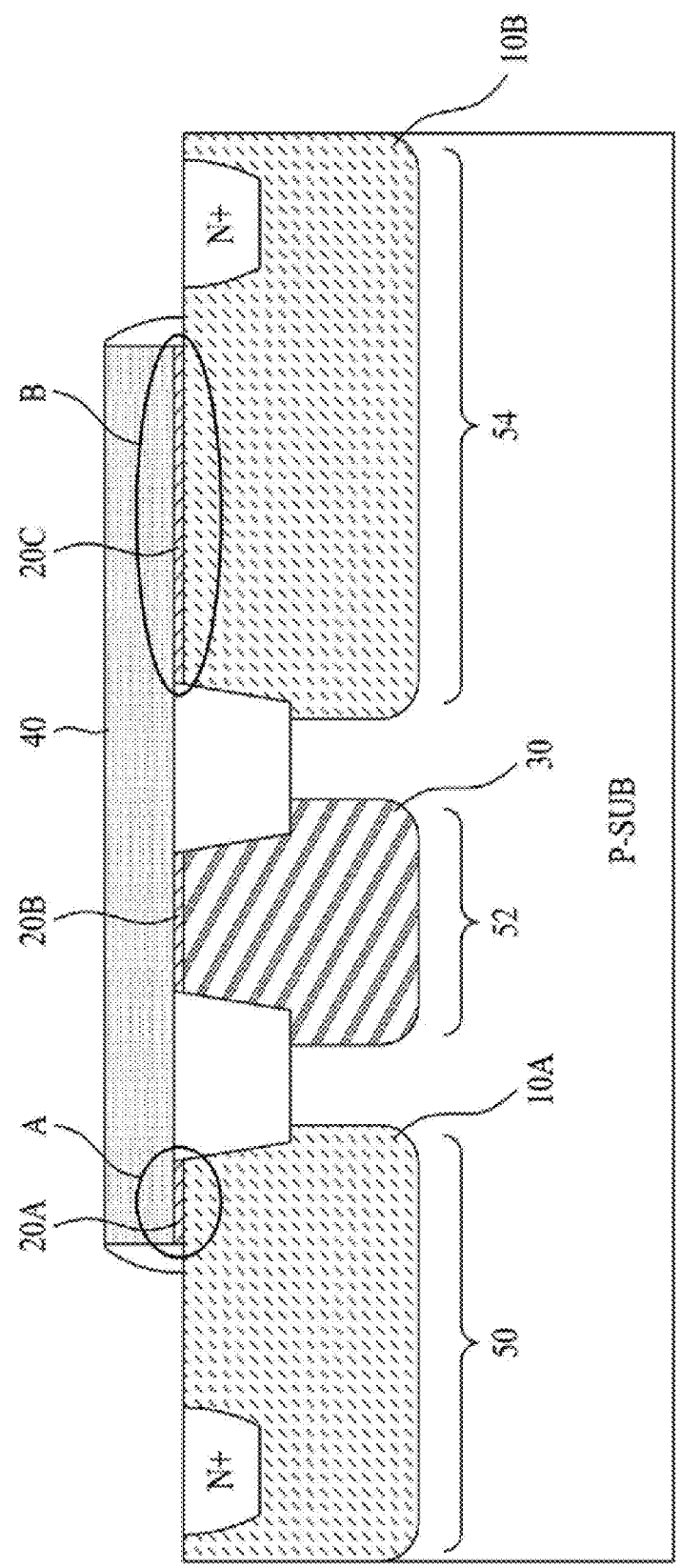
FIG. 2 is a cross-sectional view illustrating an exemplary and/or general EEPROM cell and process for manufacturing the same.

In the present invention, by forming the trench type floating poly 250 as described above, the capacitances of the control gate region and tunneling region may have a vertical configuration, realizing a smaller size than a related cell configuration (such as, e.g., the layout of FIG. 1).

Hereinafter, a method for manufacturing the single-poly type EEPROM cell according to a second embodiment of the present invention will be described with reference to the accompanying drawings.

Figure 5:
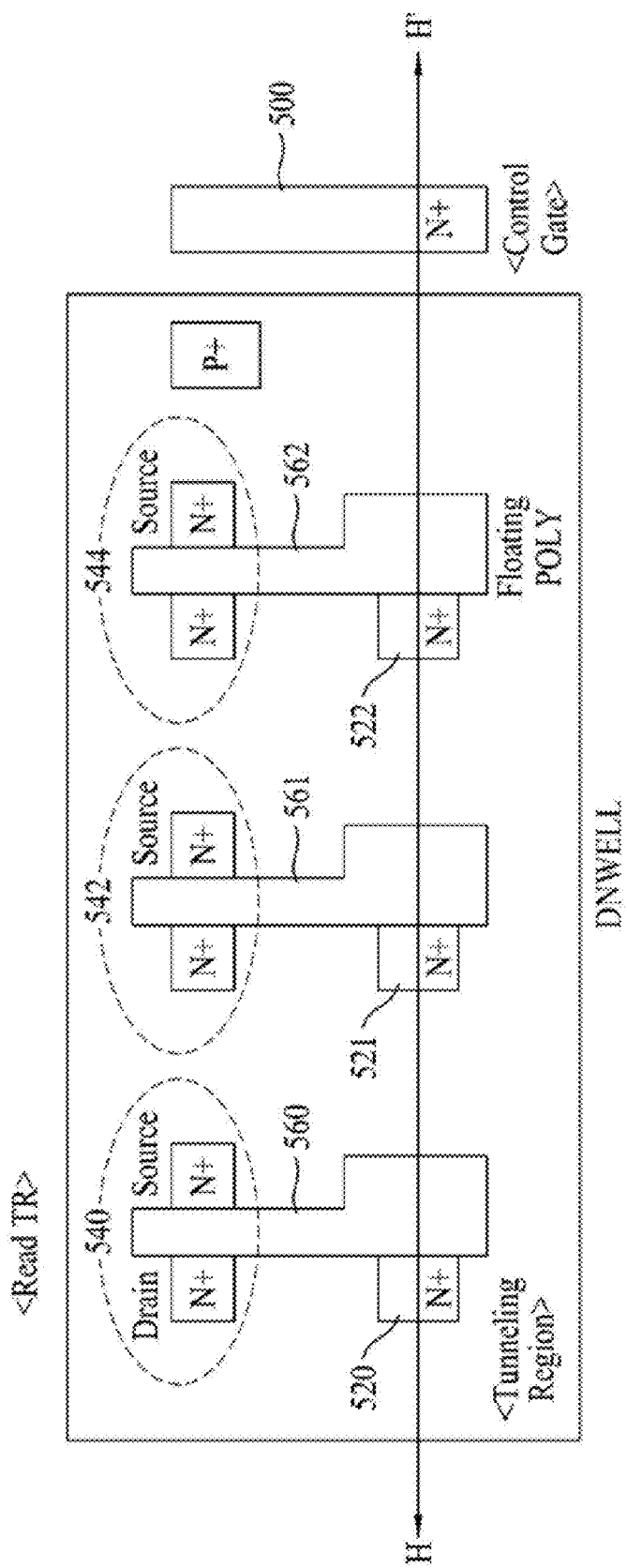
FIG. 5 is a plan or layout view of an exemplary EEPROM according to a second embodiment of the present invention.

FIG. 5 is a plan or layout view of an EEPROM including a plurality of cells, which further includes a control gate region 500 in common with each of the cells. FIG. 6D is a cross-sectional view taken along the line H-H' of FIG. 5. Tunneling regions 520 to 522 and read transistor regions 540 to 544 of the plurality of cells include the control gate region 500 in common. Floating polysilicon layers 560 to 562, as shown in FIG. 6D, are at least partially in a trench and are at sides of the respective tunneling regions 520 to 522.

Hereinafter, an exemplary method for manufacturing the EEPROM according to the second embodiment of the present invention will be described with reference to the accompanying drawings.

Figure 6A:
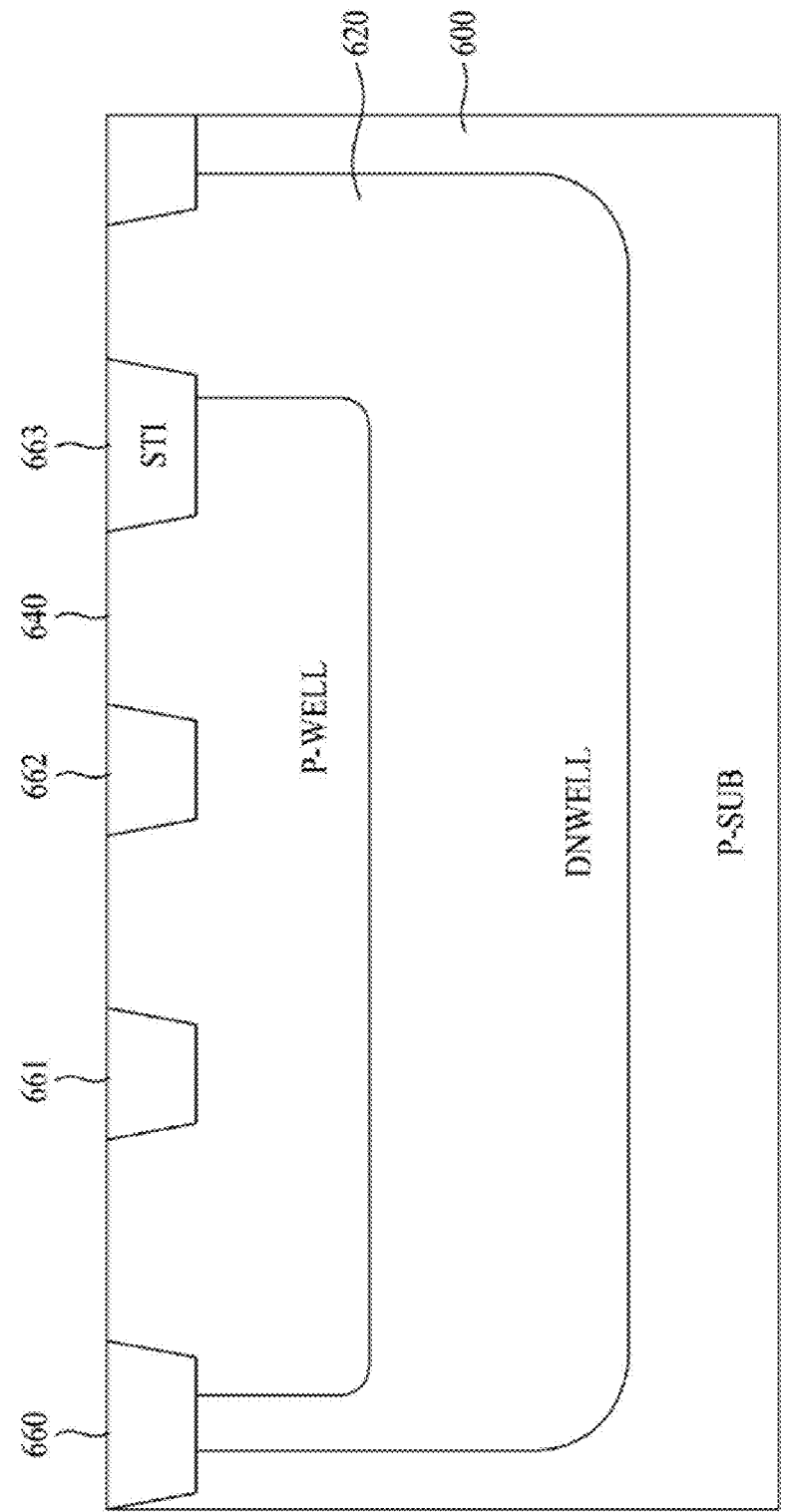
FIGS. 6A to 6D are cross-sectional views illustrating sequential intermediate structures in an exemplary process for manufacturing the EEPROM according to the second embodiment of the present invention.

As shown in FIG. 6A, ions are implanted into a semiconductor substrate 600 via an ion implantation process, forming a deep N-well 620, similar to FIG. 4A. Then, ions are implanted into an upper portion of the deep N-well 620 via an ion implantation process, forming a P-well 640. Next, device isolating layers 660 to 663 are formed similar to the STI layer 290 in FIG. 4A to define the respective tunneling regions 520 to 522 of the unit cells in the semiconductor substrate 600.

The device isolating layers 660 to 663 may be formed via an STI process, or a LOCOS process. When using the STI process, the device isolating layers 660 to 663 may be formed by forming trenches in the semiconductor substrate 600 and filling the trenches with a dielectric (e.g., silicon dioxide, which may further include a liner oxide formed by thermal oxidation and a thin liner layer of silicon nitride on the thermal oxide).

Figure 6B:
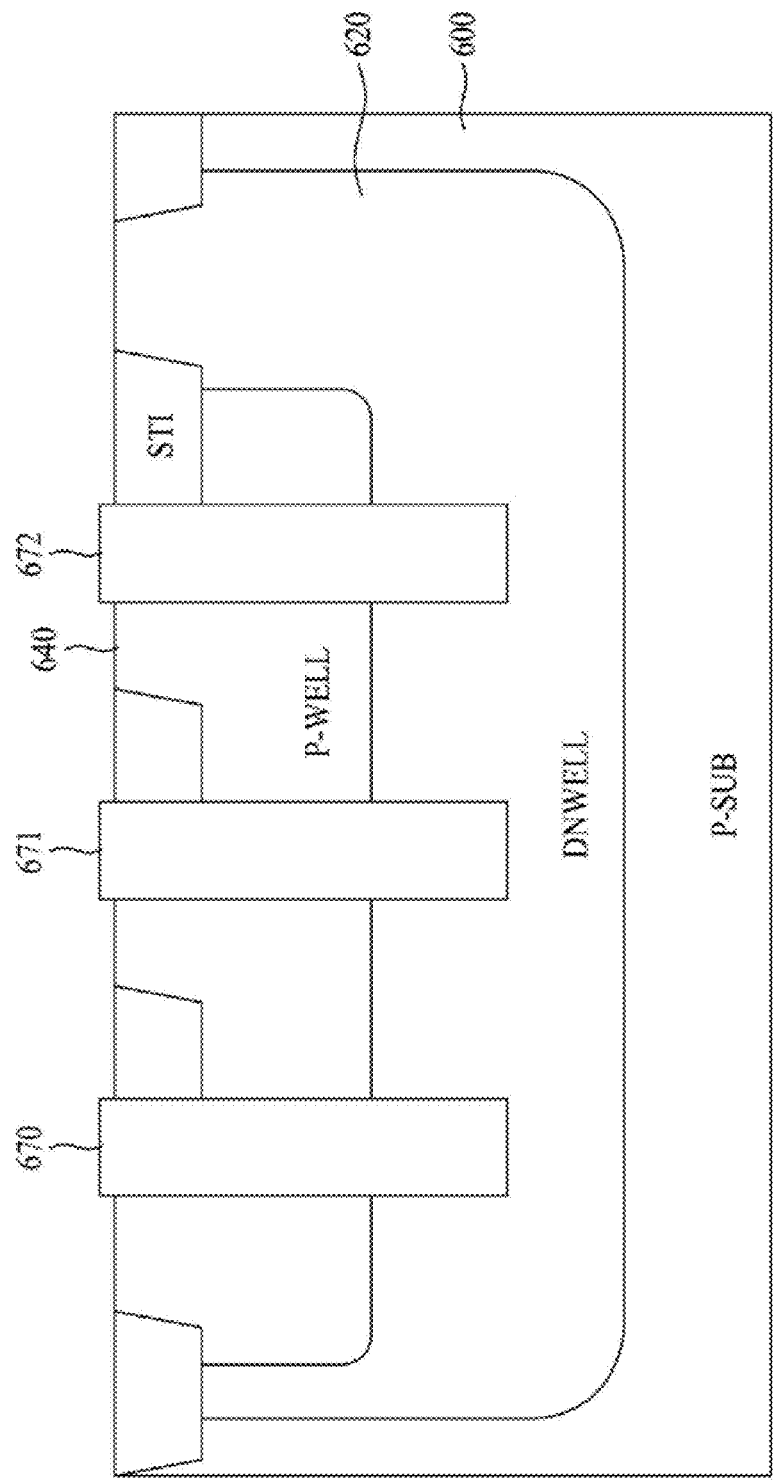

As shown in FIG. 6B, trenches 670-672 are formed on sides of the device isolating layers 660 to 663, to a depth greater than that of P-well 640 but less than that of deep N-well 620, in which the floating polysilicon layers 560 to 562 will be buried.

To form the trenches for the formation of the floating polysilicon layers 560 to 562 in the semiconductor substrate 600, a photoresist pattern (not shown) is formed on the semiconductor substrate 600, similar to trench 280 in FIG. 4B. As the semiconductor substrate 600 is etched using the photoresist pattern as an etching mask, trenches 670 to 672 are formed. Then, the photoresist pattern is removed by, e.g., an asking process. In this case, the trenches 670 to 672 should be etched to penetrate through the P-well 640 and into deep N-well 620.

Figure 6C:
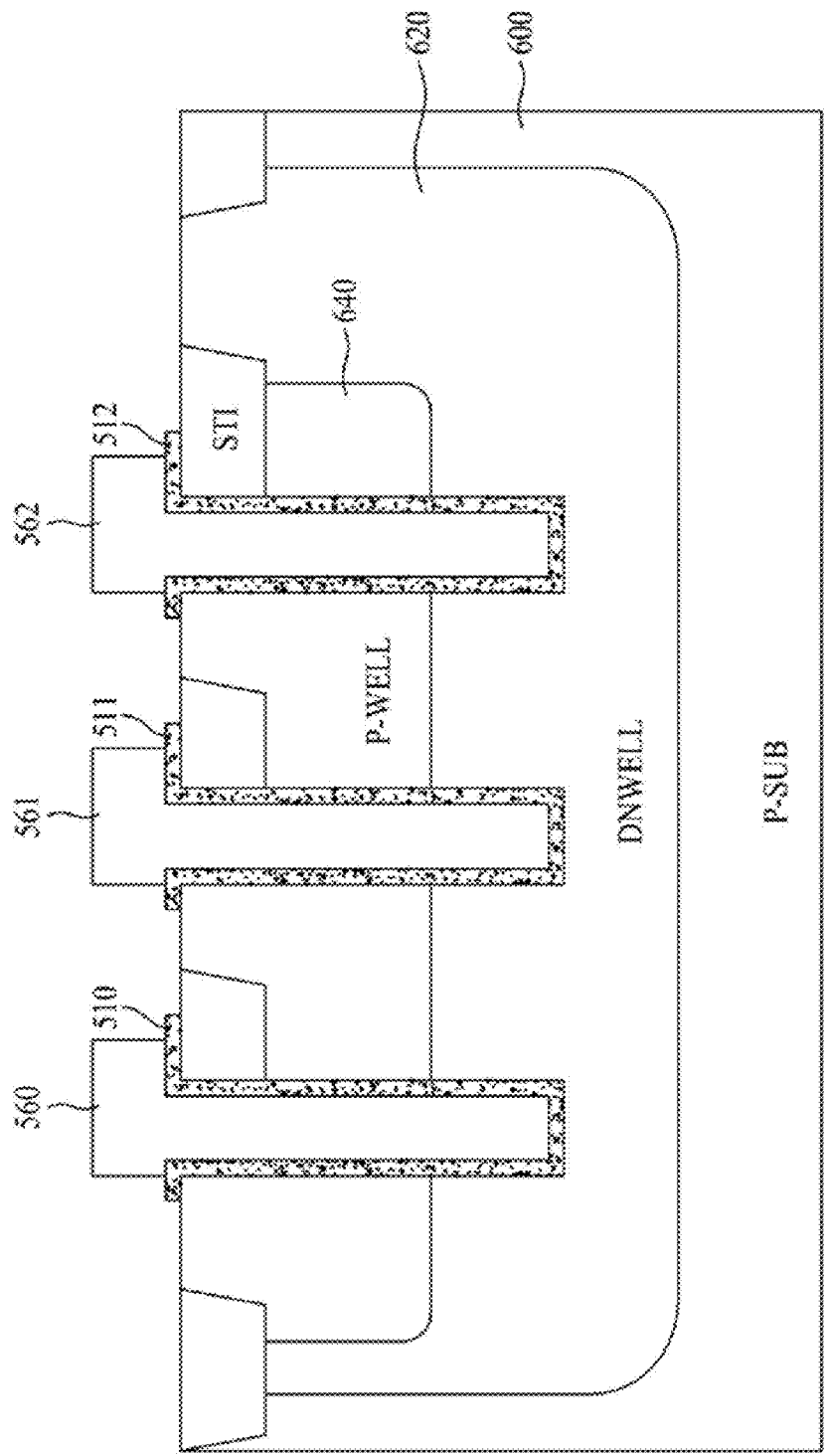
Figure 6D:
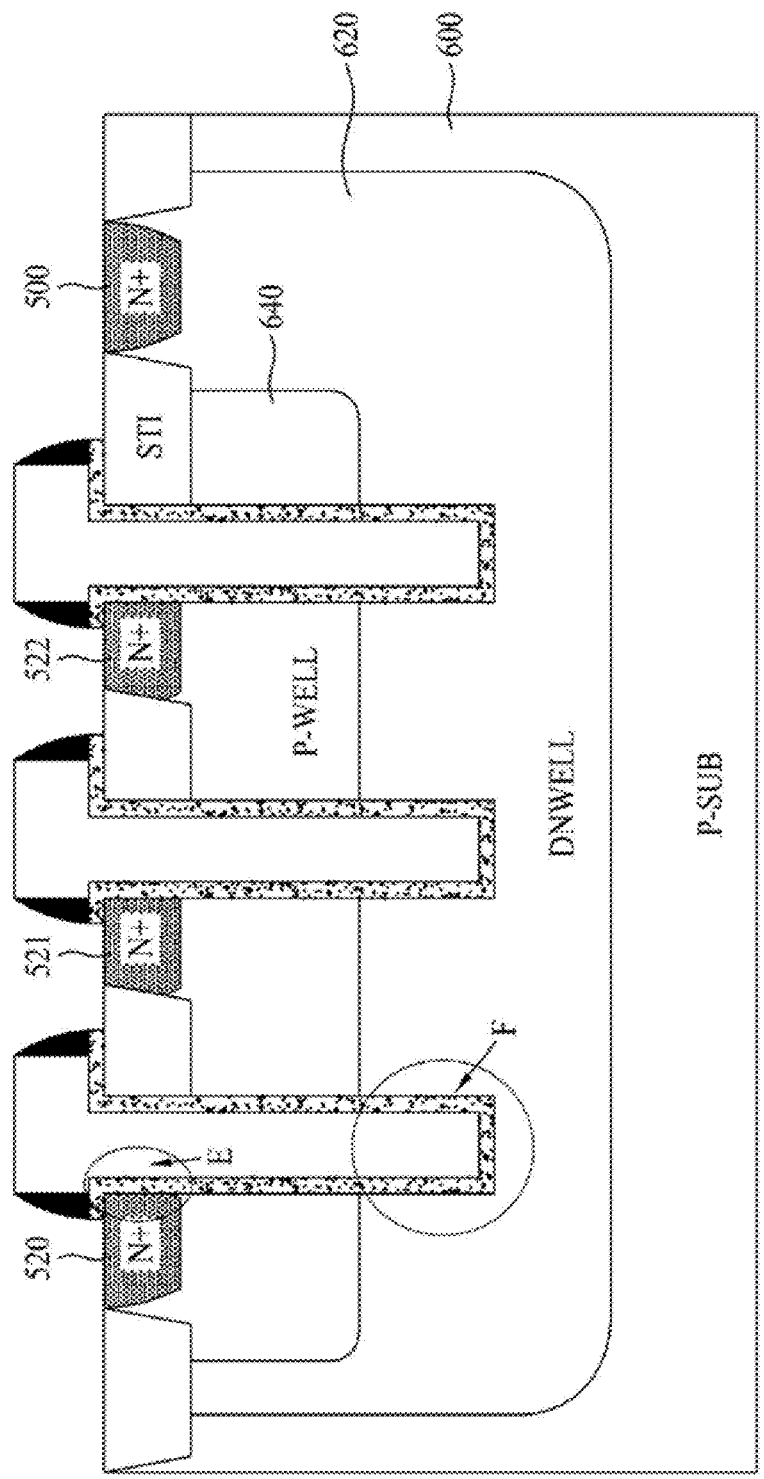

As shown in FIG. 6C, after the trenches 670 to 672 are formed in the above-described manner, tunnel oxide layers 510 to 512 are formed on inner walls of the trenches 670 to 672 substantially similarly to tunnel oxide 230 in FIG. 4C. In turn, the floating polysilicon layers 560 to 562 are formed on the tunnel oxide layers 510 to 512, generally by blanket deposition and photolithography, as in FIG. 4C. However, as shown in FIG. 6C, floating polysilicon gates 560 to 562 are etched separately from and selectively (e.g., with an etchant having an etch selectivity of at least 10:1) with respect to the tunnel oxide layers 510 to 512.

As shown in FIG. 6D, sidewall spacers are formed on sidewalls of floating polysilicon gates 560 to 562 (generally by blanket deposition of one or more silicon dioxide and/or silicon nitride layers), and ions are implanted into side surfaces of the floating polysilicon layers 560 to 562 via an ion implantation process, forming N+ dopant regions 520 to 522. The N+ dopant regions 520 to 522 are tunneling regions. Also, an N+ dopant region 500 is formed (generally at the same time as N+ dopant regions 520 to 522) in an upper portion of the deep N-well 620, forming the control gate region 500. In one implementation, after selectively etching the floating polysilicon gates 560 to 562, the sidewall spacers are formed, then the tunnel oxide layer is etched selectively to floating polysilicon gates 560 to 562, an exposed material of the sidewall spacers, and N+ dopant regions 520 to 522 to expose the substrate 600 prior to ion implantation to form N+ dopant regions 520 to 522.

The tunneling regions 520 to 522 include the control gate region 500 in common, and the floating polysilicon layers 560 to 562 are formed throughout the respective tunneling regions 520 to 522 and the control gate region 500. Since the floating polysilicon layers 560 to 562 are formed at least partially in a trench, a capacitance 'E' of each tunneling region and a capacitance 'F' of the deep N-well 620 have a vertical configuration. Accordingly, as the floating polysilicon layers 560 to 562 between the tunneling regions 520 to 522 and the control gate region 500 are vertically formed based on the design rule(s) shown in FIG. 6D, the floating polysilicon layers 560 to 562 on a horizontal plane of the semiconductor substrate may be reduced in length or area, similar to floating gate 250 in FIG. 4D, resulting in a reduced semiconductor chip size and stable EEPROM operation.

In the present invention, as the plurality of cells include the control gate region in common and the trench type floating polysilicon layers 560-562, the capacitances of the control gate region and tunneling region may have a vertical configuration, resulting in a reduced semiconductor chip size.

As is apparent from the above description, according to the present invention, as a result of forming a floating poly at least partially in a trench, a higher cell density may be advantageously accomplished without an increase in the area of a cell. Further, according to the present invention, as a result of forming a plurality of floating polysilicon layers in a trench and allowing a plurality of cells to include a control gate region in common, a reduced semiconductor chip size may be accomplished.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An electrically erasable programmable read only memory (EEPROM) comprising:
    a tunneling region in a semiconductor substrate, wherein the semiconductor comprises a second type deep well and a first type well in the second type deep well;
    a control gate region in the semiconductor substrate;
    a device isolating layer separating the tunneling region and the control gate region;
    a tunnel oxide layer in a trench through the first type well and into the second type deep well, between the tunneling region and the control gate region; and
    a polysilicon layer on the tunnel oxide layer.

2. The EEPROM according to claim 1, wherein the polysilicon layer acts as a floating gate.

3. The EEPROM according to claim 1, wherein the tunnel oxide layer enables a programming operation and an erasing operation.

4. The EEPROM according to claim 1, wherein the first type well comprises a N-type well, the second type deep well comprises a P-type well, the tunneling region comprises a first N+ dopant region on one side of the polysilicon layer, and the control gate region comprises a second N+ dopant region in the first type well, on an opposite side of the polysilicon layer.

5. A method for manufacturing an electrically erasable programmable read only memory (EEPROM) comprising:
    forming a tunneling region and a control gate region in a semiconductor substrate such that the control gate region is separated from the tunneling region by a device isolating layer, wherein the semiconductor comprises a second type deep well and a first type well in the second type deep well;
    forming a trench through the first type well and into the second type deep well, between the tunneling region and the control gate region;
    forming a tunnel oxide layer in the trench; and
    forming a polysilicon layer on the tunnel oxide layer.

6. The method according to claim 5, wherein forming the first type well comprises implanting N-type dopant ions, and forming the second type deep well comprises implanting P-type dopant ions, and the method further comprises implanting first and second N+ dopant regions in the tunneling region and the control gate region, respectively, on opposite sides of the polysilicon layer.

7. An electrically erasable programmable read only memory (EEPROM) comprising:
    a plurality of tunneling regions in a semiconductor substrate, wherein the semiconductor comprises a second type deep well and a first type well in the second type deep well;
    a control gate region in the semiconductor substrate in common with the plurality of tunneling regions; and
    a floating poly in trenches in the semiconductor substrate, through the first type well and into the second type deep well at sides of the respective tunneling regions, the floating poly being between adjacent tunneling regions or between one of said tunneling regions and the control gate region.

8. The EEPROM according to claim 7, wherein the floating poly comprises a polysilicon layer.

9. The EEPROM according to claim 7, wherein the floating poly acts as a floating gate.

10. A method for manufacturing an electrically erasable programmable read only memory (EEPROM) comprising:
    forming a second type deep well in a semiconductor substrate;
    forming a first type well in the second type deep well;
    forming trenches through the first type well and into second type deep well;
    forming a floating poly in the trenches; and
    forming a plurality of tunneling regions in the first type well and a control gate region outside the first type well and in the second type deep well.

11. The method according to claim 10, wherein the floating poly comprises a polysilicon layer.

12. The method according to claim 10, further comprising: forming a tunnel oxide layer on an inner wall of each of the trenches.

13. The method according to claim 10, wherein forming the first type well and second type deep well comprises implantation of different dopant ions.

14. The method according to claim 13, wherein forming the first type well comprises implanting N-type dopant ions, and forming the second type deep well comprises implanting P-type dopant ions.

15. The method according to claim 10, wherein the plurality of tunneling regions includes the control gate region in common.

16. The method according to claim 10, further comprising forming a plurality of device isolation regions in the plurality of tunneling regions and between each tunneling region and an adjacent control gate region.

17. The EEPROM according to claim 1, wherein the device isolation layer and the first type well are at a same side of the trench.

18. The EEPROM according to claim 7, wherein the first type well comprises a N-type well, and the second type deep well comprises a P-type well.

19. The EEPROM according to claim 18, wherein each of the tunneling regions comprises an N+ dopant region between the trench and the device isolation layer.

20. The method according to claim 14, further comprising implanting a plurality of N+ dopant regions in the plurality of tunneling regions, between the polysilicon layer and the device isolation layer.

* * * * *